(12) United States Patent
Vincent et al.

(10) Patent No.: US 11,404,288 B1
(45) Date of Patent: Aug. 2, 2022

(54) SEMICONDUCTOR DEVICE PACKAGING WARPAGE CONTROL

(71) Applicant: NXP USA, INC., Austin, TX (US)

(72) Inventors: Michael B. Vincent, Chandler, AZ (US); Scott M. Hayes, Chandler, AZ (US); Zhiwei Gong, Chandler, AZ (US); Vivek Gupta, Phoenix, AZ (US); Richard Te Gan, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/209,710

(22) Filed: Mar. 23, 2021

(51) Int. Cl.
| | |
|---|---|
| *H01L 21/56* | (2006.01) |
| *H01L 23/00* | (2006.01) |
| *H01L 21/67* | (2006.01) |
| *H01L 21/78* | (2006.01) |

(52) U.S. Cl.
CPC ........ *H01L 21/56* (2013.01); *H01L 21/67288* (2013.01); *H01L 21/78* (2013.01); *H01L 23/562* (2013.01); *H01L 2924/3511* (2013.01)

(58) Field of Classification Search
CPC . H01L 2924/3511; H01L 21/56; H01L 21/67; H01L 21/67288; H01L 21/78; H01L 23/00; H01L 23/562
See application file for complete search history.

(56) References Cited

U.S. PATENT DOCUMENTS

| | | | |
|---|---|---|---|
| 7,950,144 B2 | 5/2011 | Ramanathan et al. | |
| 8,758,552 B2 | 6/2014 | Canale et al. | |
| 8,829,661 B2 | 9/2014 | Lytle et al. | |
| 8,832,924 B2 | 9/2014 | Mizumata | |
| 9,107,303 B2 | 8/2015 | Lytle et al. | |
| 9,420,694 B2 | 8/2016 | Chung | |
| 9,786,520 B2 | 10/2017 | Liu et al. | |
| 2009/0047754 A1* | 2/2009 | Chen .................. | H01L 24/96 438/108 |
| 2009/0289339 A1* | 11/2009 | Hu .................... | H01L 23/3128 257/E23.116 |
| 2012/0139192 A1 | 6/2012 | Ooi | |
| 2014/0077381 A1 | 3/2014 | Lin et al. | |
| 2015/0371969 A1* | 12/2015 | Yu ..................... | H01L 23/562 438/106 |

(Continued)

FOREIGN PATENT DOCUMENTS

JP        2015079832 A     4/2015

OTHER PUBLICATIONS

Lau, J., "Recent Advances and Trends in Fan-Out Wafer/Panel-Level Packaging", Journal of Electronic Packaging, vol. 141, Dec. 2019.

(Continued)

*Primary Examiner* — Thanh T Nguyen

(57) ABSTRACT

A method of manufacturing a semiconductor device packaging panel is provided. The method includes forming a panel by placing a plurality of semiconductor die on a major side of a carrier substrate and encapsulating with an encapsulant the plurality semiconductor die and the major side of the carrier substrate. A plurality of warpage control features are formed with the encapsulant while encapsulating. The method further includes placing the panel onto a warpage control fixture to substantially flatten the panel. The plurality of warpage control features interlock with mating features of the warpage control fixture.

20 Claims, 19 Drawing Sheets

(56) References Cited

U.S. PATENT DOCUMENTS

2016/0351462 A1* 12/2016 Kuan .................. H01L 24/96
2019/0341356 A1    11/2019 Chung et al.
2020/0066655 A1     2/2020 Eid et al.

OTHER PUBLICATIONS

Baozong, Z., "FEA Simulation and In-situ Warpage Monitoring of Laminated Package Molded with Green EMC Using Shadow Morie System", 2006 7th International Conference on Electronic Packaging Technology, Aug. 26-29, 2006.
Che, F.X., "Study on Warpage of Fan-Out Panel Level Packaging (FO-PLP) using Gen-3 Panel", 2019 IEEE 69th Electronic Components and Technology Conference (ECTC), May 28-31, 2019.
U.S. Appl. No. 17/230,098, filed Apr. 14, 2021, and entitled "Semiconductor Device Packaging Warpage Control".
U.S. Appl. No. 17/337,583, filed Jun. 3, 2021, and entitled "Semiconductor Device Packaging Warpage Control".

* cited by examiner

SEMICONDUCTOR DEVICE PACKAGING WARPAGE CONTROL

BACKGROUND

Field

This disclosure relates generally to semiconductor device packaging, and more specifically, to a semiconductor device packaging warpage control.

Related Art

Today, many electronic products include semiconductor devices formed from panel-level packaging of semiconductor die. With panel-level packaging, connections to the semiconductor die may be formed after panel encapsulation. After encapsulation, there is a problem referred to as panel warping that can occur as an effect of the encapsulation. Warping is of particular concern in panel-level packaging as forming connections to the semiconductor die can be difficult thus affecting yield, reliability, and costs. Therefore, it is desirable to overcome problems associated with panel-level packaging.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device packaging process and apparatus for panel warpage control. Device packaging panels are formed having warpage control features configured to mate with features incorporated in a warpage control fixture. By interlocking the warpage control features with the mating features of the warpage control fixture, tension can be applied to the packaging panels in a manner sufficient to substantially flatten the panels. With the panels substantially flattened, subsequent planar-sensitive processing steps can be applied allowing for improved yield, reliability, and costs.

Figure 1:
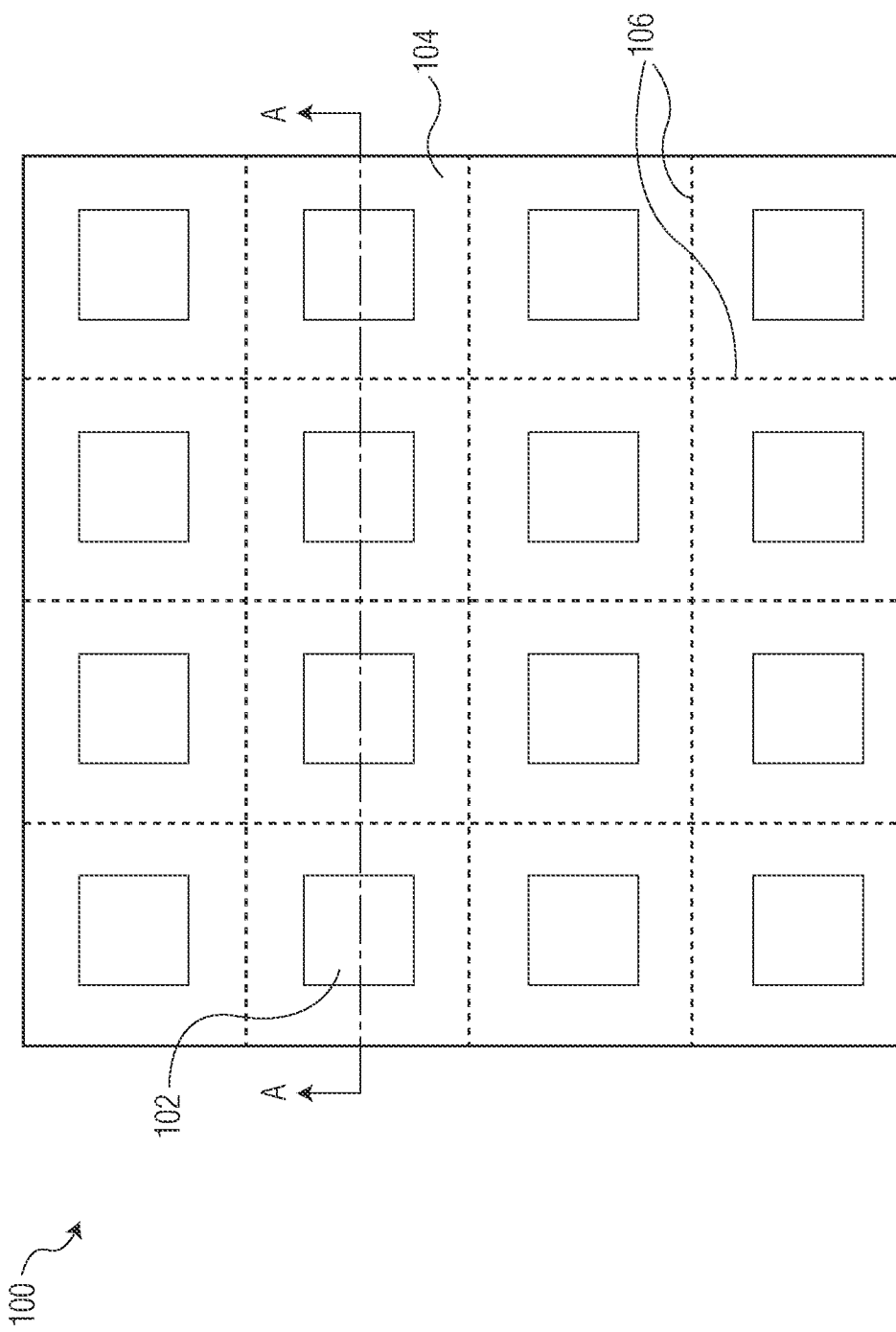
FIG. 1 illustrates, in a simplified plan view, an example semiconductor device packaging panel having warpage control features at a stage of manufacture in accordance with an embodiment.
Figure 2:
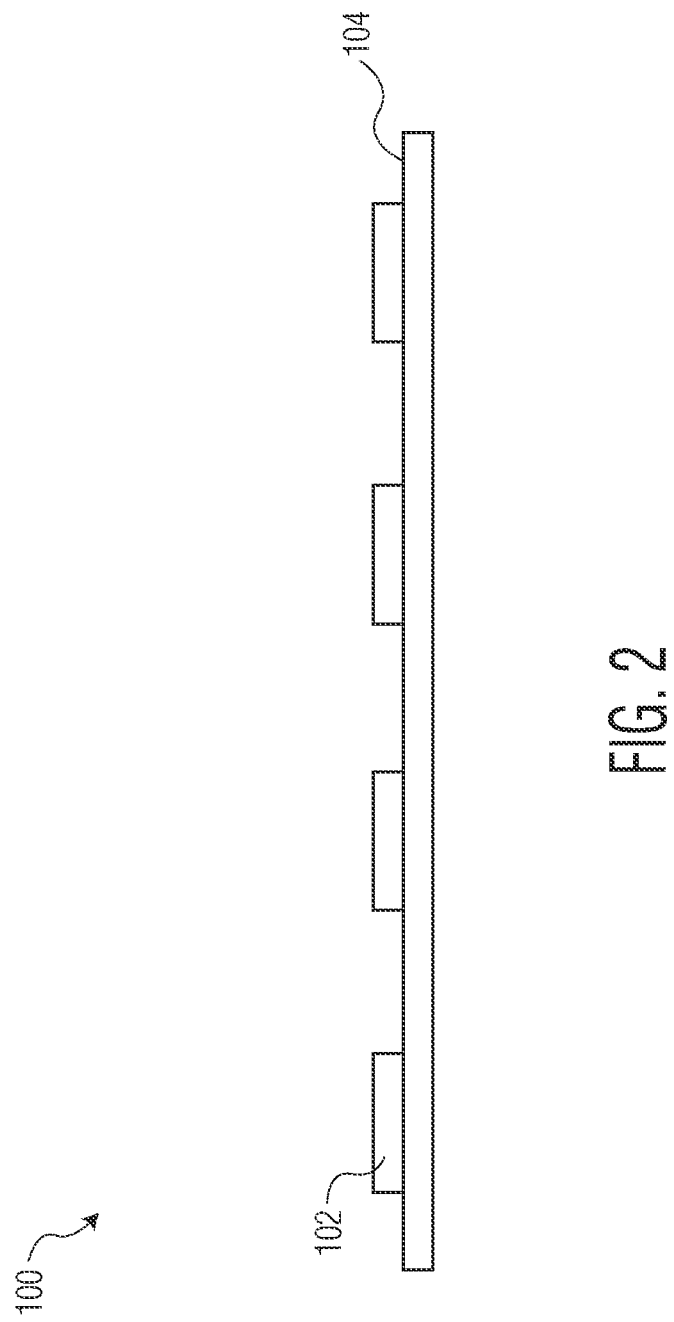
FIG. 2 through FIG. 9 illustrate, in simplified cross-sectional views, the example semiconductor device packaging panel at stages of manufacture in accordance with an embodiment.

FIG. 1 illustrates, in a simplified plan view, an example semiconductor device packaging panel 100 having warpage control features at a stage of manufacture in accordance with an embodiment. FIG. 2 illustrates, in a simplified cross-sectional view, the panel 100 at the stage of manufacture depicted in FIG. 1. At this stage of manufacture, the panel 100 includes a plurality of semiconductor die 102 placed on a carrier substrate 104. In this embodiment, the panel 100 includes an array of package sites having four rows by four columns. In this embodiment, each package site includes at least one semiconductor die 102 of the plurality. The package sites are depicted by way of predetermined singulation lanes 106 shown as dashed lines. In this embodiment, 16 package sites are depicted to form 16 packaged semiconductor devices after singulation. In other embodiments, the panel 100 may include fewer than 16 package sites or more than 16 package sites.

The semiconductor die 102 has an active surface (e.g., major surface having circuitry) and a backside surface (e.g., major surface opposite of the active surface). The semiconductor die 102 includes bond pads (not shown) at the active surface configured for connection to printed circuit board (PCB) by way of redistribution layer (RDL), for example. The semiconductor die 102 may be formed from any suitable semiconductor material, such as silicon, germanium, gallium arsenide, gallium nitride and the like. The semiconductor die 102 may further include any digital circuits, analog circuits, RF circuits, memory, signal processor, MEMS, sensors, the like, and combinations thereof. In addition to the semiconductor die 102, other components, devices, and/or structures may be included in the package sites such as discrete devices, embedded substrates, copper structures (e.g., embedded ground plane), and the like.

The carrier substrate 104 has a top major surface and a bottom major surface. The carrier substrate 104 is configured and arranged to provide a temporary structure for placement of semiconductor die 102 and encapsulation at a subsequent stage of manufacture. The carrier substrate 104 may be formed from any suitable material such as glass, metal, silicon wafer, or organic material. The carrier substrate 104 may be formed in any suitable shape such as round, square, or rectangular. An adhesive, double-sided tape or film, or the like (not shown) is applied to the major surface of the carrier substrate for temporary die attachment and subsequent encapsulation. In this embodiment, the semiconductor die 102 of the plurality are placed active surface down onto the top major side of the carrier substrate 104.

Figure 3:
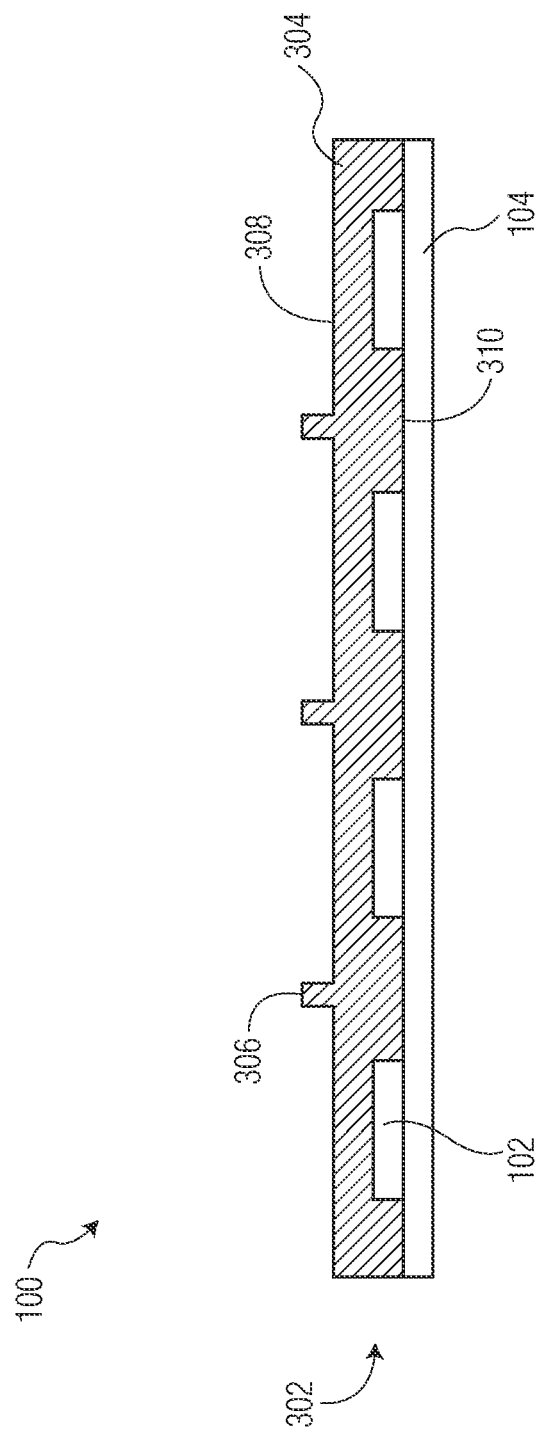

FIG. 3 illustrates, in a simplified cross-sectional view, the example semiconductor device packaging panel 100 at a subsequent stage of manufacture in accordance with an embodiment. At this stage of manufacture, the panel 100 further includes a plurality of warpage control features 306 formed from an encapsulant (e.g., epoxy material) 304 which encapsulates the plurality of semiconductor die 102 and the top side of the carrier substrate 104. In this embodiment, the semiconductor die 102 placed on the carrier substrate 104 are over-molded with the encapsulant 304 having a first major surface 308 and a second major surface 310. A post-mold flat condition 302 of panel 100 is depicted after over-molding with the encapsulant 304. The plurality of warpage control features 306 are configured and arranged for interlocking with a warpage control fixture at a subsequent stage of manufacture to substantially flatten the panel 100.

The plurality of warpage control features 306 may be formed in any suitable shapes and sizes which extend outward from the plane of the first major surface 308. For example, the plurality of warpage control features 306 may be formed as posts (e.g., round, square, rectangular), ridges, and combinations thereof. The plurality of warpage control features 306 may be located in any suitable locations at the first major surface 308. In this embodiment, the plurality of warpage control features 306 is characterized as a plurality of protrusions (306) extending from the first major surface 308 of the encapsulant 304. For example, the plurality of warpage control features 306 may be formed as a series of posts substantially arranged and aligned with the singulation lanes (106) such that the warpage control features 306 are removed during a singulation operation at a subsequent stage of manufacture.

Figure 4:
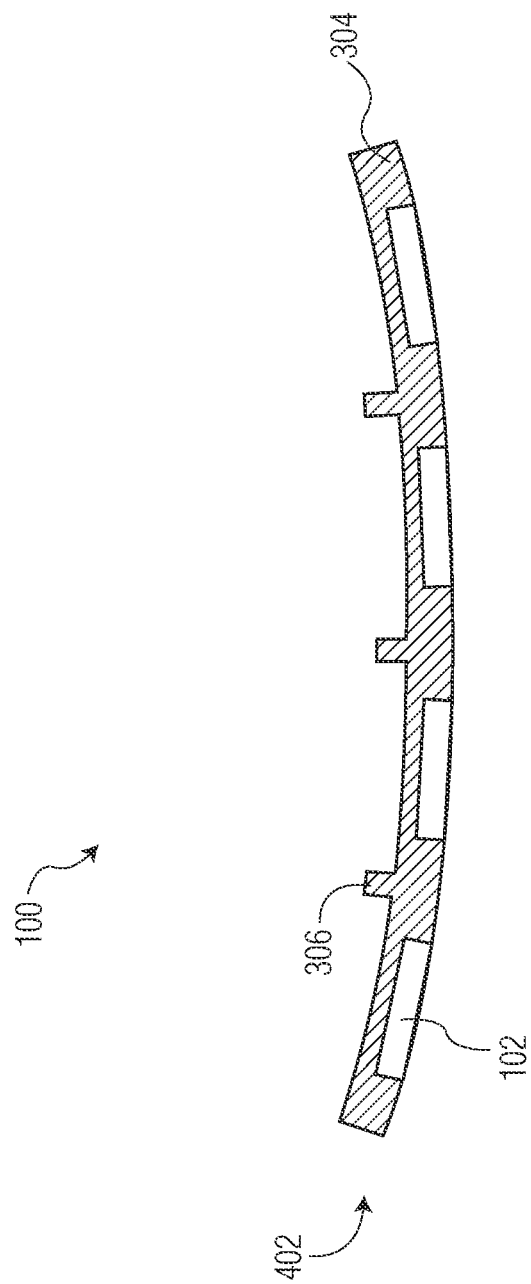

FIG. 4 illustrates, in a simplified cross-sectional view, the example semiconductor device packaging panel 100 at a subsequent stage of manufacture in accordance with an embodiment. At this stage of manufacture, the encapsulant 304 is cured and the carrier substrate (104) is removed. A post-mold warped condition 402 of panel 100 is depicted after removal from the carrier substrate (104). The warped condition 402 may result from effects of differing thermal expansion coefficients of the semiconductor die 102 and encapsulant 304 during cure, for example. With other components, devices, and/or structures included in the package sites of the panel, additional dissimilar materials having further differing thermal expansion coefficients may exacerbate the warped condition 402.

Figure 5:
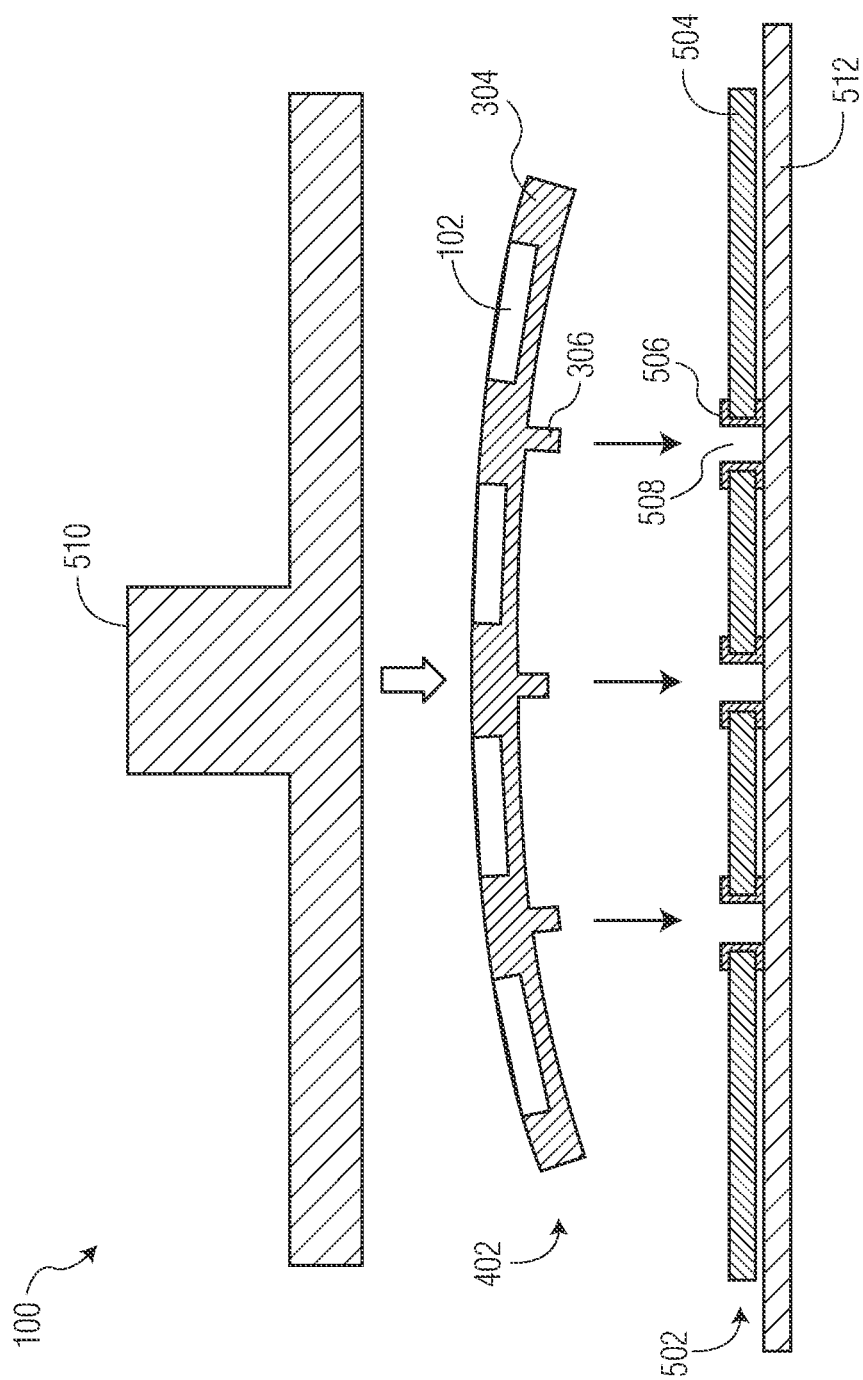

FIG. 5 illustrates, in a simplified cross-sectional view, the example semiconductor device packaging panel 100 at a subsequent stage of manufacture in accordance with an embodiment. At this stage of manufacture, the panel 100 having the warped condition 402 is oriented (e.g., flipped) and positioned over a warpage control fixture 502. In this embodiment, the warpage control fixture 502 includes a stretchable film 504 and a rigid plate 512. A plurality of mating features 508 (e.g., openings) are incorporated into the stretchable film 502. The plurality of mating features 508 are arranged and located to correspond with the plurality of warpage control features 306 formed on the panel. Reinforcement structures (e.g., collars, eyelets) 506 are formed to reinforce openings of the mating features 508. The reinforcement structures 506 may be formed from any suitable rigid material (e.g., metal) and may be formed in any suitable shape to accommodate interlocking with the warpage control features 306. In this embodiment, the mating features 508 are characterized as openings in the film 504 of the warpage control fixture 502 configured to mate with the plurality of protrusions 306. In this embodiment, a press tool 510 is configured to mechanically press the panel 100 having the warped condition 402 onto the warpage control fixture 502 causing the warpage control features 306 to interlock with the mating features 508. For example, the warpage control features 306 of the panel 100 and the mating features 508 of the warpage control fixture 502 lock in place by contacting each other. In this embodiment, the rigid plate 512 of the warpage control fixture 502 is configured to serve as a backstop allowing the press tool 510 to apply pressure to the panel causing the panel to flatten.

Figure 6:
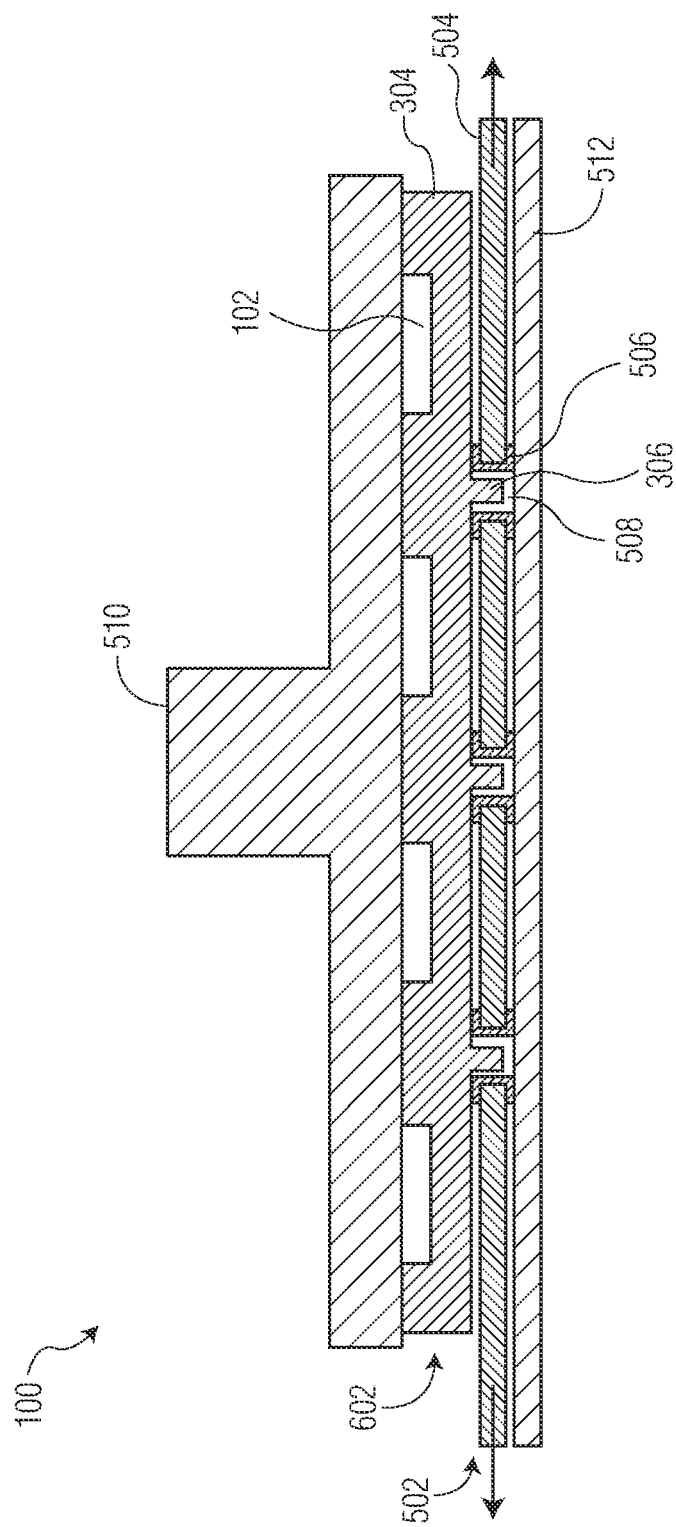

FIG. 6 illustrates, in a simplified cross-sectional view, the example semiconductor device packaging panel 100 at a subsequent stage of manufacture in accordance with an embodiment. At this stage of manufacture, a substantially flattened condition 602 of panel 100 is formed. With the press tool 510 pressing on the panel and the warpage control features 306 interlocked with the mating features 508, the film 504 of the warpage control fixture 502 is stretched to apply tension on the panel to retain the flattened condition 602 formed by the press tool 510. In this embodiment, tension may be applied in two dimensions (e.g., X and Y directions within the plane of the film 504) to form and/or sustain the substantially flattened condition 602.

Figure 7:
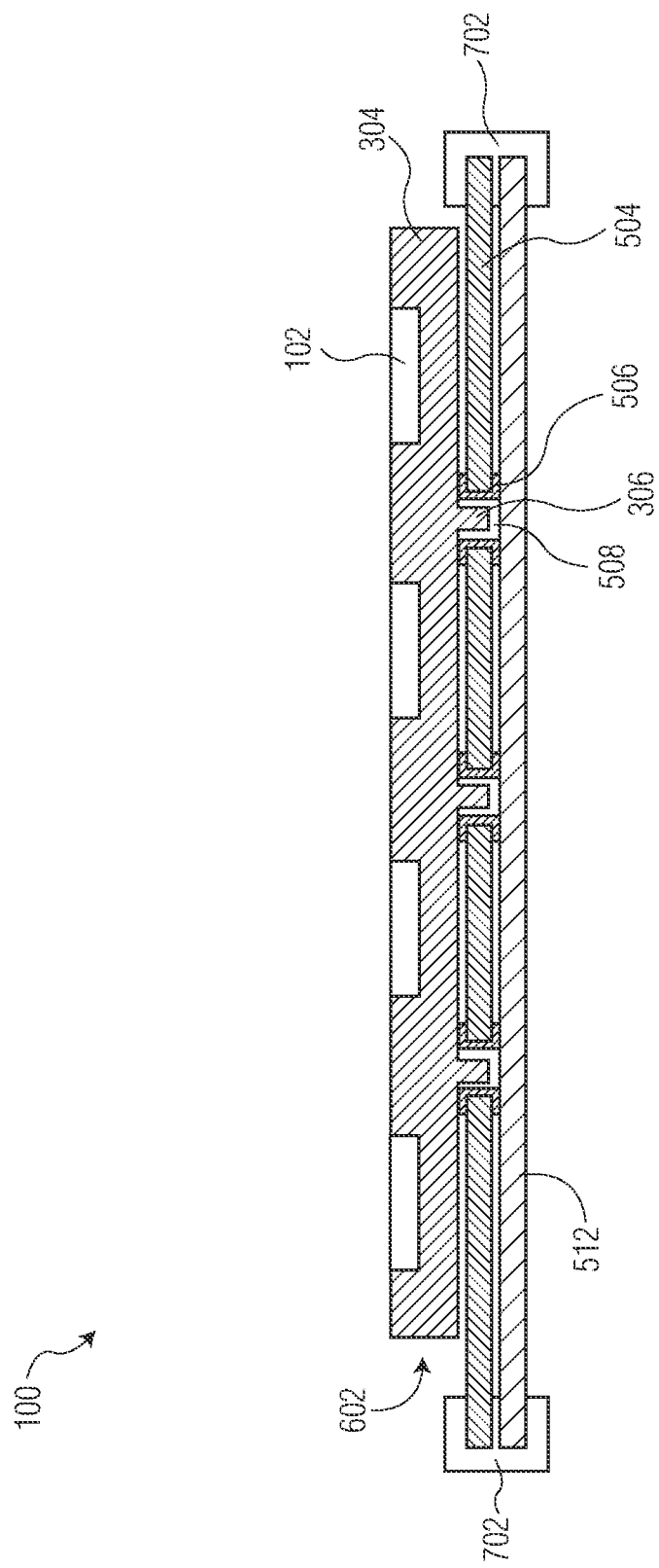

FIG. 7 illustrates, in a simplified cross-sectional view, the example semiconductor device packaging panel 100 at a subsequent stage of manufacture in accordance with an embodiment. At this stage of manufacture, the substantially flattened condition 602 of panel 100 is secured by way of a clamping tool 702. With the film 504 of the warpage control fixture 502 stretched and applying tension on the panel, the clamping tool is engaged to clamp and secure the stretched film 504 to sustain the substantially flattened condition 602 of panel 100. After clamping the stretched film 504 on the warpage control fixture 502, the press tool (510) is retracted.

Figure 8:
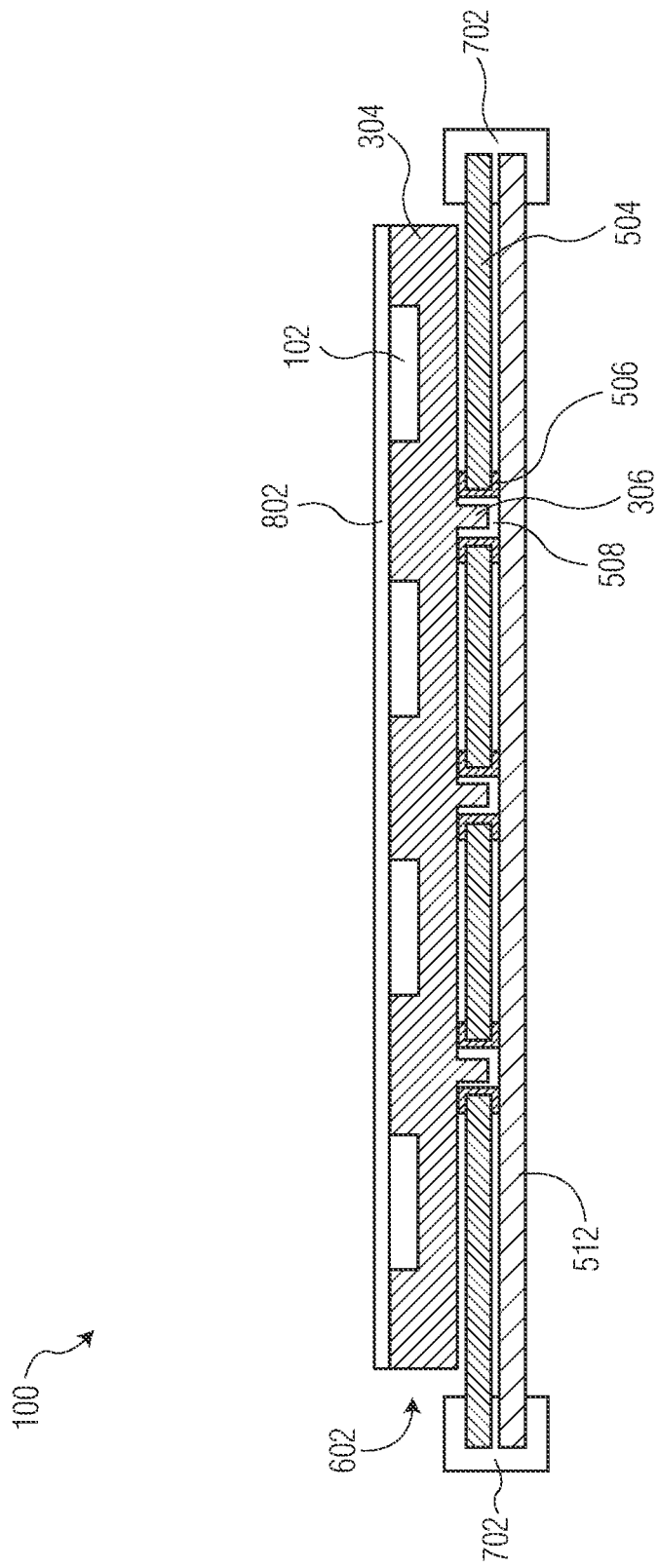

FIG. 8 illustrates, in a simplified cross-sectional view, the example semiconductor device packaging panel 100 at a subsequent stage of manufacture in accordance with an embodiment. At this stage of manufacture, a processing layer 802 is formed on panel 100 while secured in the warpage control fixture (502). With the substantially flattened panel 100 secured in the warpage control fixture (502), the panel 100 may be subjected to planar-sensitive processing steps to form the processing layer 802. In this embodiment, the processing layer 802 may be characterized as a redistribution layer (RDL) formed over the active surface of the semiconductor die 102 and portions of the encapsulant 304. For example, the processing layer 802 may be formed as a series of patterned layers including a conductive layer sandwiched between a first non-conductive layer and a second non-conductive layer. In this example, the first non-conductive layer is deposited directly on the semiconductor die 102 and portions of the encapsulant 304 with openings formed over the bond pads of the semiconductor die 102. The conductive layer is deposited over the first non-conductive layer and patterned to form conductive redistribution traces connected to the bond pads. The second non-conductive layer is deposited over the patterned conductive layer with openings formed to expose portions of the conductive traces for forming conductive connections between the semiconductor die 102 and a printed circuit board by way of connectors such as solder balls, gold studs, and the like.

Figure 9:
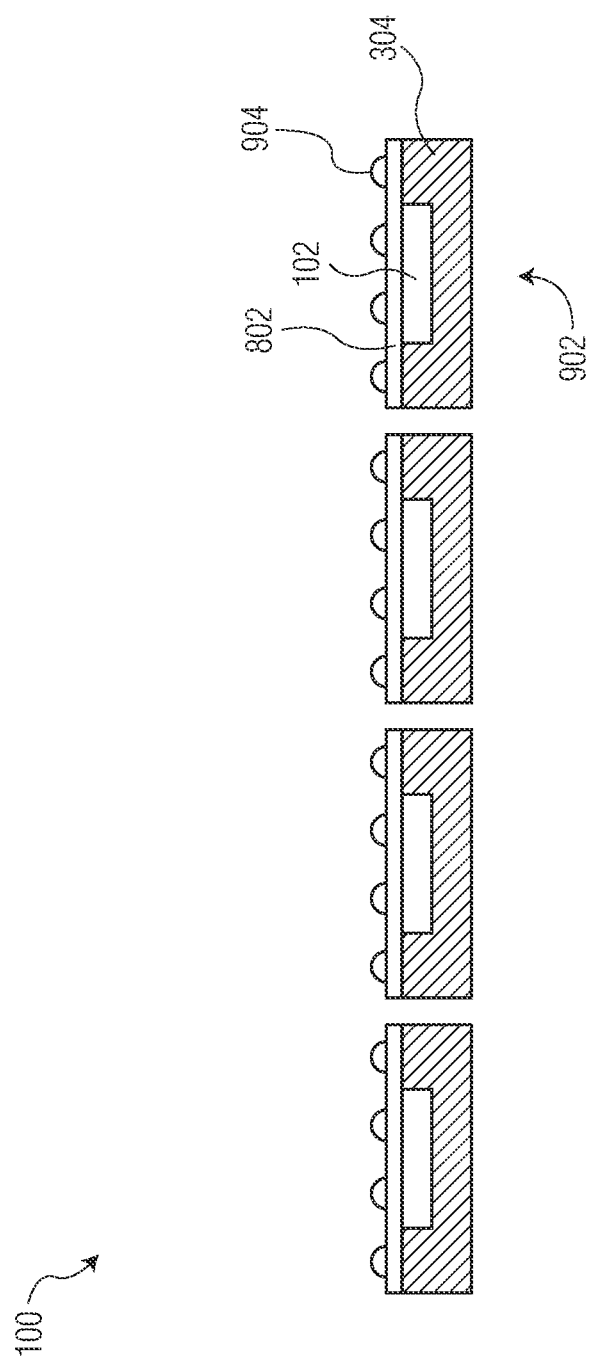

FIG. 9 illustrates, in a simplified cross-sectional view, the example semiconductor device packaging panel 100 at a subsequent stage of manufacture in accordance with an embodiment. At this stage of manufacture, a completed panel 100 is singulated into individual semiconductor device units 902. In this embodiment, the individual semiconductor device units 902 include conductive ball connectors 904 (e.g., solder balls) interconnected to the semiconductor die 102 by way of the processing layer 802 (e.g., RDL). The panel 100 may be singulated using known methods and techniques such as mechanical sawing, laser cutting, and combinations thereof. In some embodiments, the plurality of warpage control features (306) are removed during singulation when the warpage control features are located within the singulation lanes (106). In some embodiments, the panel 100 may be subjected to back-grind operation to remove the plurality of warpage control features before singulation.

Figure 10:
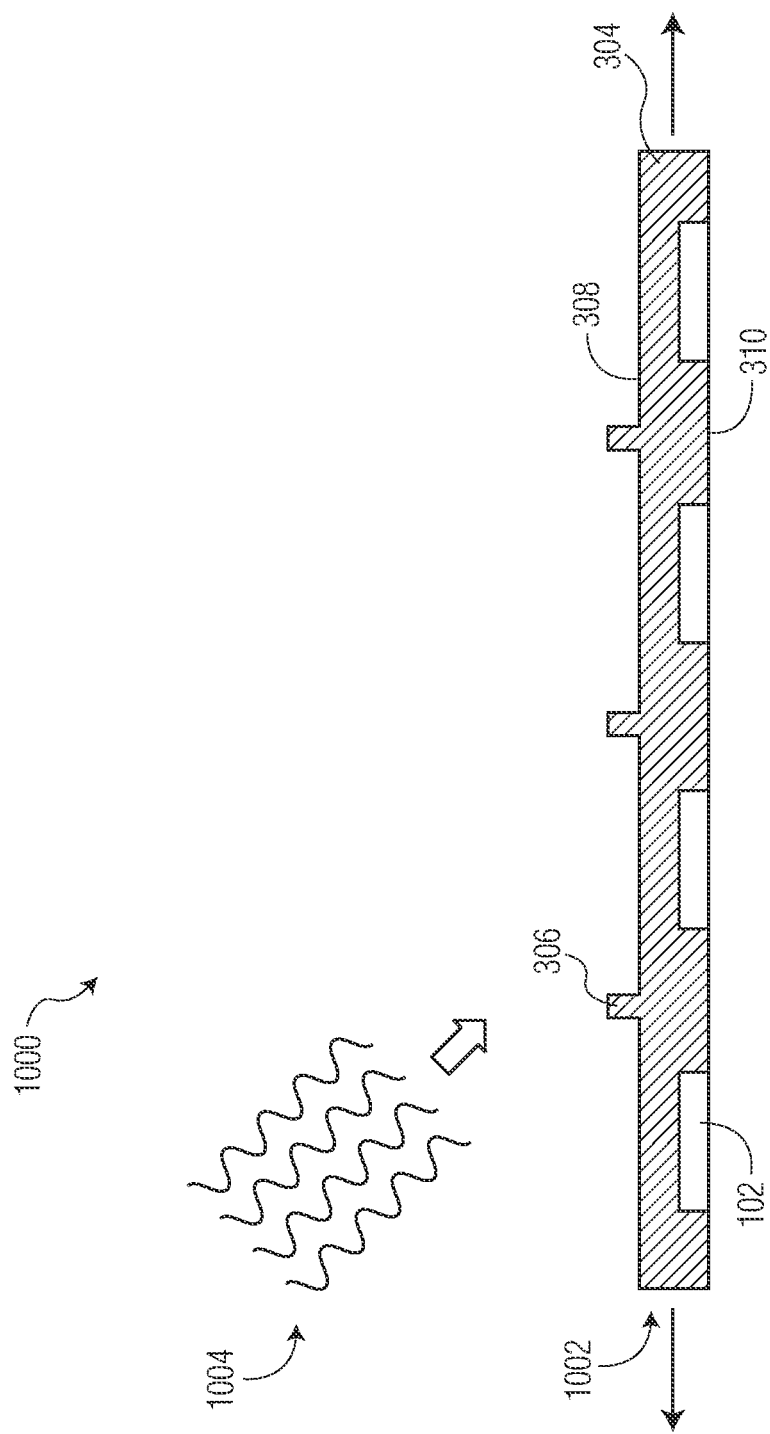
FIG. 10 through FIG. 13 illustrate, in simplified cross-sectional views, the example semiconductor device packaging panel at alternative stages of manufacture in accordance with an embodiment.

FIG. 10 illustrates, in a simplified cross-sectional view, an example semiconductor device packaging panel 1000 at an alternate stage of manufacture in accordance with an embodiment. The alternate stage of manufacture depicted in FIG. 10 is subsequent to the stage of manufacture depicted in FIG. 4, for example. At this alternate stage of manufacture, the panel 100 having the warped condition 402 as depicted in FIG. 4 is subjected to a heat treatment 1004. In this embodiment, a substantially flattened condition 1002 of panel 1000 is formed by way of the heat treatment 1004. For example, the heat treatment 1004 may include applying heat at a predetermined temperature (e.g., −125 to 200° C.) over a predetermined amount of time (e.g., −10 to 200 minutes) sufficient to cause the panel 1000 to expand and thus form the substantially flattened condition 1002. At this stage, the panel 1000 further includes the plurality of warpage control features 306 formed from the encapsulant 304 which encapsulates the plurality of semiconductor die 102.

Figure 11:
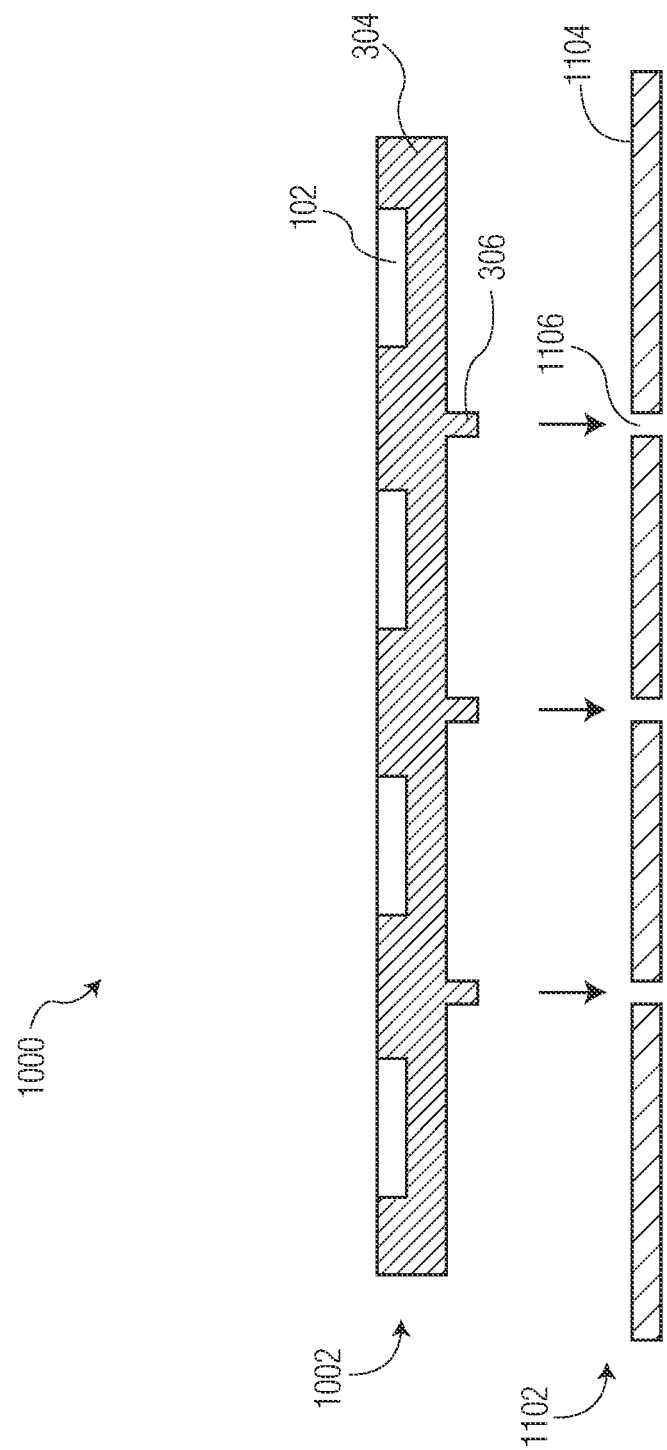

FIG. 11 illustrates, in a simplified cross-sectional view, the example semiconductor device packaging panel 1000 at a subsequent stage of manufacture in accordance with an embodiment. At this stage of manufacture, the panel 1000 having the substantially flattened condition 1002 is oriented (e.g., flipped) and positioned over a warpage control fixture 1102. In this embodiment, the warpage control fixture 1102 includes a rigid (e.g., metal) plate 1104 having plurality of mating features 1106 (e.g., openings) incorporated into the plate. The plurality of mating features 1106 are arranged and located to correspond with the plurality of warpage control features 306 formed on the panel. In this embodiment, the mating features 1106 are characterized as recesses in the warpage control fixture 1102 configured to mate with the plurality of protrusions 306. In this embodiment, the panel 1000 is at or near the predetermined temperature sufficient for causing the panel to be in the flattened condition 1002 when the warpage control features 306 are interlocked with the mating features 1106.

Figure 12:
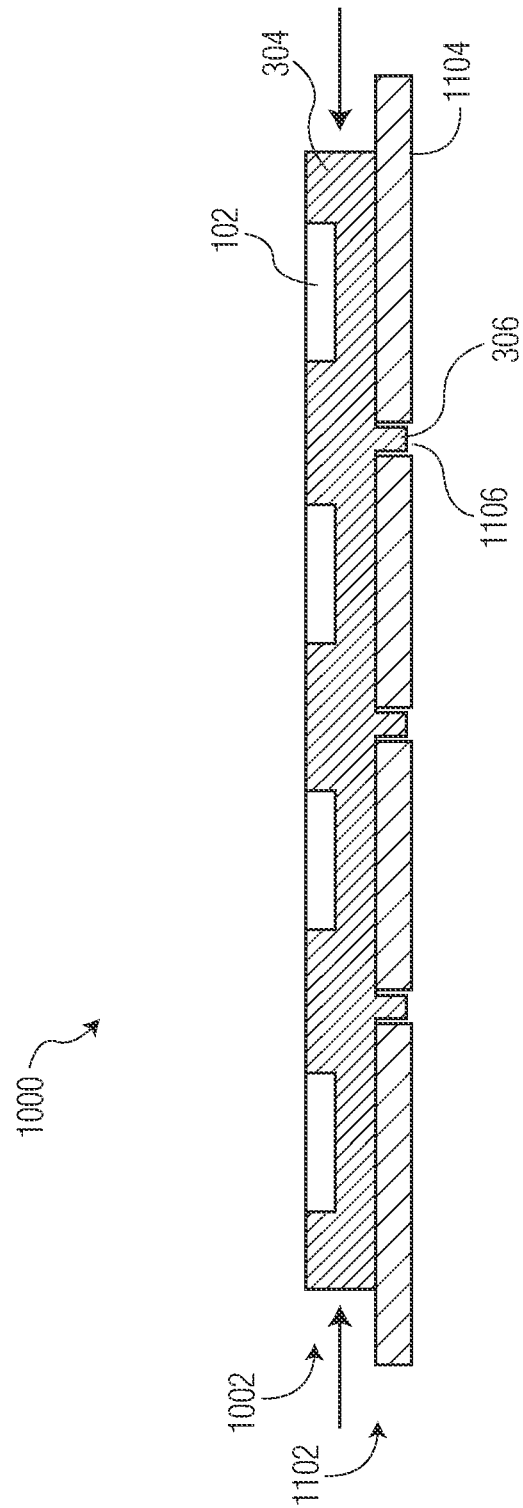

FIG. 12 illustrates, in a simplified cross-sectional view, the example semiconductor device packaging panel 1000 at a subsequent stage of manufacture in accordance with an embodiment. At this stage of manufacture, the warpage control features 306 of the panel 1000 having the substantially flattened condition 1002 are interlocked with the mating features 1106 of the warpage control fixture 1102. In this embodiment, the panel 1000 shrinks as it cools causing tension to be applied to the panel by way of the warpage control features 306 interlocked with the mating features 1106. With tension applied on the panel 1000 in this manner, the panel 1000 is secured in the warpage control fixture 1102 and the substantially flattened condition 1002 is sustained.

Figure 13:
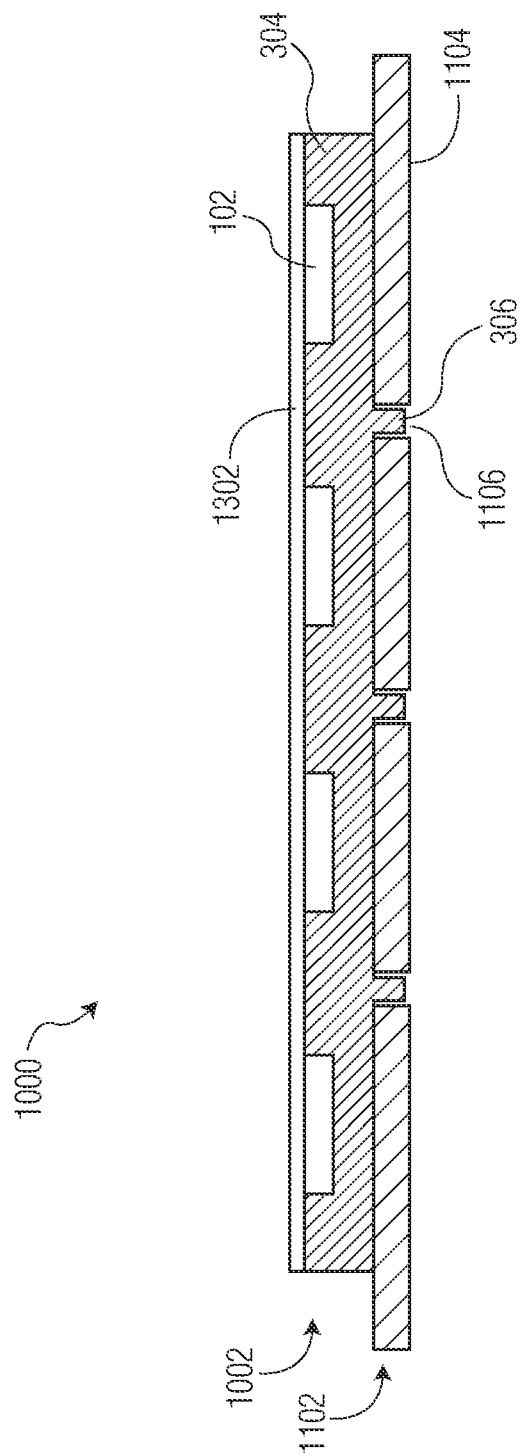

FIG. 13 illustrates, in a simplified cross-sectional view, the example semiconductor device packaging panel 1000 at a subsequent stage of manufacture in accordance with an embodiment. At this stage of manufacture, a processing layer 1302 is formed on panel 1000 while secured in the warpage control fixture 1102. With the substantially flattened panel 1000 secured in the warpage control fixture 1102, the panel 1000 may be subjected to planar-sensitive processing steps to form the processing layer 1302. In this embodiment, the processing layer 1302 may be characterized as a redistribution layer (RDL) formed over the active surface of the semiconductor die 102 and portions of the encapsulant 304. For example, the processing layer 1302 may be formed as a series of patterned layers including a conductive layer sandwiched between a first non-conductive layer and a second non-conductive layer.

After forming the processing layer 1302, a completed panel 1000 is singulated into individual semiconductor device units using known methods and techniques such as mechanical sawing, laser cutting, and combinations thereof. In some embodiments, the plurality of warpage control features 306 are removed during singulation when the warpage control features are located within the singulation lanes (106). In some embodiments, the panel 1000 may be subjected to back-grind operation to remove the plurality of warpage control features before singulation.

Figure 14:
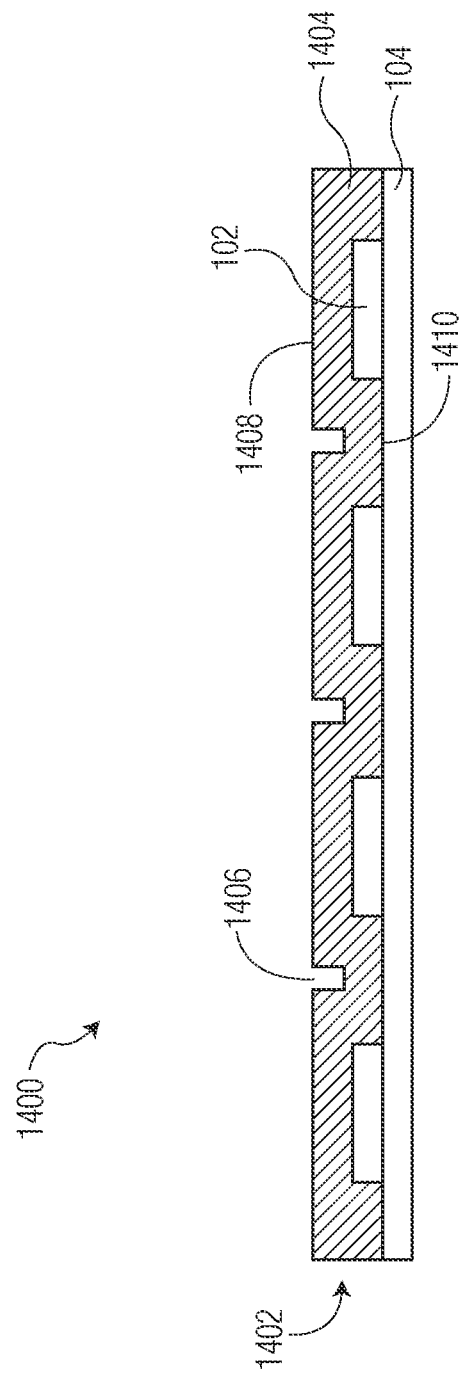
FIG. 14 through FIG. 19 illustrate, in simplified cross-sectional views, an alternative example semiconductor device packaging panel at stages of manufacture in accordance with an embodiment.

FIG. 14 illustrates, in a simplified cross-sectional view, an example semiconductor device packaging panel 1400 at an alternate stage of manufacture in accordance with an embodiment. The alternate stage of manufacture depicted in FIG. 14 is subsequent to the stage of manufacture depicted in FIG. 2, for example. At this alternate stage of manufacture, the panel 1400 includes a plurality of warpage control features 1406 formed from an encapsulant (e.g., epoxy material) 1404 which encapsulates the plurality of semiconductor die 102 and the top side of the carrier substrate 104. In this embodiment, the semiconductor die 102 placed on the carrier substrate 104 are over-molded with the encapsulant 1404 having a first major surface 1408 and a second major surface 1410. A post-mold flat condition 1402 of panel 1400 is depicted after over-molding with the encapsulant 1404. The plurality of warpage control features 1406 are configured and arranged for interlocking with a warpage control fixture at a subsequent stage of manufacture to substantially flatten the panel 1400.

The plurality of warpage control features 1406 may be formed in any suitable shapes and sizes which recess below the plane of the first major surface 1408. For example, the plurality of warpage control features 1406 may formed as holes (e.g., round, square, rectangular), troughs, valleys, and combinations thereof. The plurality of warpage control features 1406 may be located in any suitable locations at the first major surface 1408. In this embodiment, the plurality of warpage control features 1406 is characterized as a plurality of cavities at the first major surface 1408 of the encapsulant 1404. For example, the plurality of warpage control features 1406 may be formed as a series of holes or depressions substantially arranged and aligned with the singulation lanes (106) such that the warpage control features 1406 are removed during a singulation operation at a subsequent stage of manufacture. In some embodiments, the plurality of warpage control features may be formed as a combination of warpage control feature types such as a first group of the plurality formed as protrusions (306) extending from the major surface (308) of the encapsulant as depicted in FIG. 3 and a second group of the plurality formed as cavities 1406 at the first major surface 1408 of the encapsulant as depicted in FIG. 14.

Figure 15:
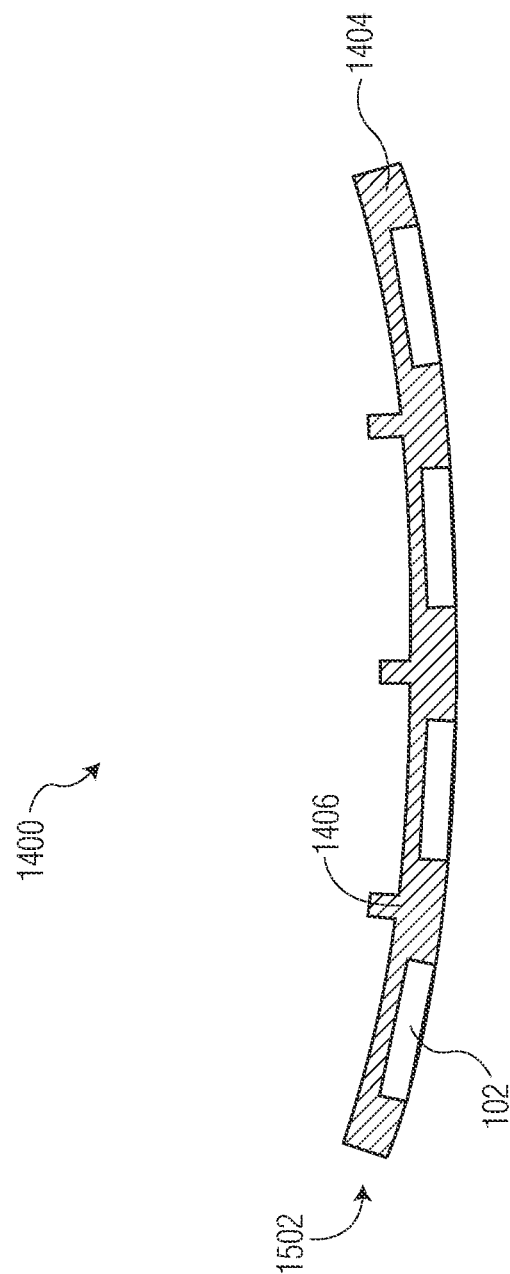

FIG. 15 illustrates, in a simplified cross-sectional view, the example semiconductor device packaging panel 1400 at a subsequent stage of manufacture in accordance with an embodiment. At this stage of manufacture, the encapsulant 1404 is cured and the carrier substrate (104) is removed. A post-mold warped condition 1502 of panel 1400 is depicted after removal from the carrier substrate (104). The warped condition 1502 may result from effects of differing thermal expansion coefficients of the semiconductor die 102 and encapsulant 1404 during cure, for example.

Figure 16:
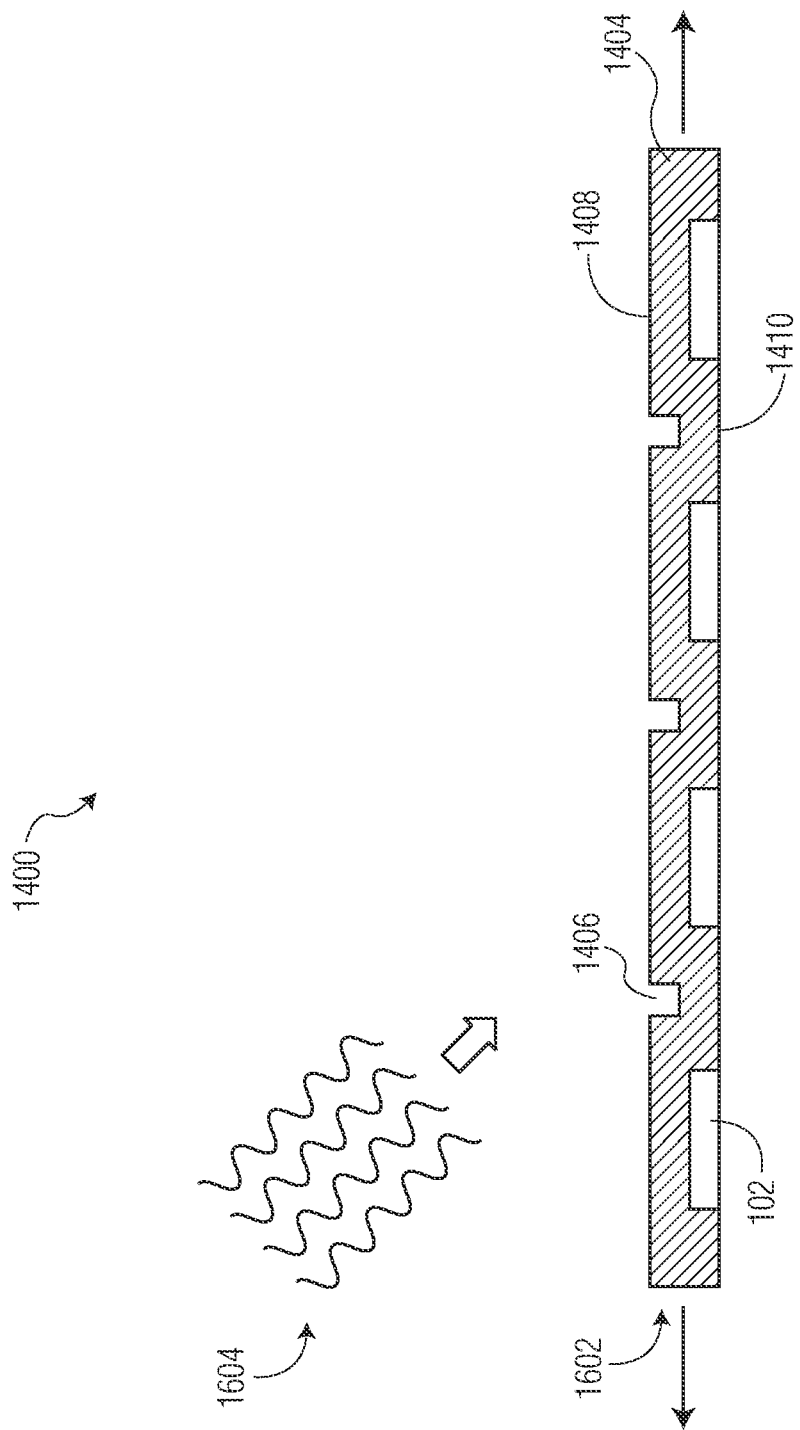

FIG. 16 illustrates, in a simplified cross-sectional view, an example semiconductor device packaging panel 1400 at a subsequent stage of manufacture in accordance with an embodiment. At this stage of manufacture, a substantially flattened condition 1602 of panel 1400 is formed by way of a heat treatment 1604. The panel 1400 having the warped condition 1502 as depicted in FIG. 15 is subjected to the heat treatment 1604 causing the panel to substantially flatten. For example, the heat treatment 1604 may include applying heat at a predetermined temperature over a predetermined amount of time sufficient to cause the panel 1400 to expand and thus form the substantially flattened condition 1602.

Figure 17:
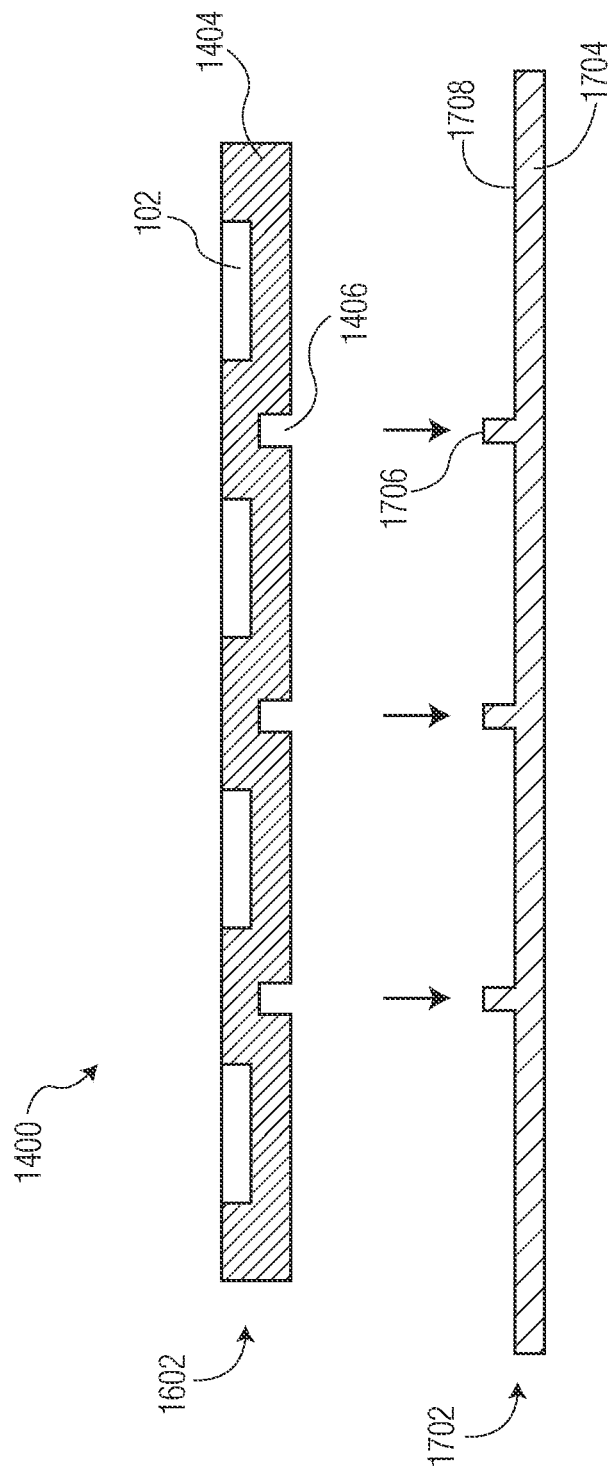

FIG. 17 illustrates, in a simplified cross-sectional view, the example semiconductor device packaging panel 1400 at a subsequent stage of manufacture in accordance with an embodiment. At this stage of manufacture, the panel 1400 having the substantially flattened condition 1602 is oriented (e.g., flipped) and positioned over a warpage control fixture 1702. In this embodiment, the warpage control fixture 1702 includes a rigid (e.g., metal) plate 1704 having plurality of mating features 1706 (e.g., protrusions) incorporated into the plate. The plurality of mating features 1706 extend from the major surface 1708 of the plate 1704 and are arranged and located to correspond with the plurality of warpage control features 1406 formed on the panel. In this embodiment, the mating features 1706 are characterized as protrusions in the warpage control fixture 1702 configured to mate with the plurality of cavities 1406. In this embodiment, the panel 1400 is at or near the predetermined temperature sufficient for causing the panel to be in the flattened condition 1602 when the warpage control features 1406 are interlocked with the mating features 1706.

Figure 18:
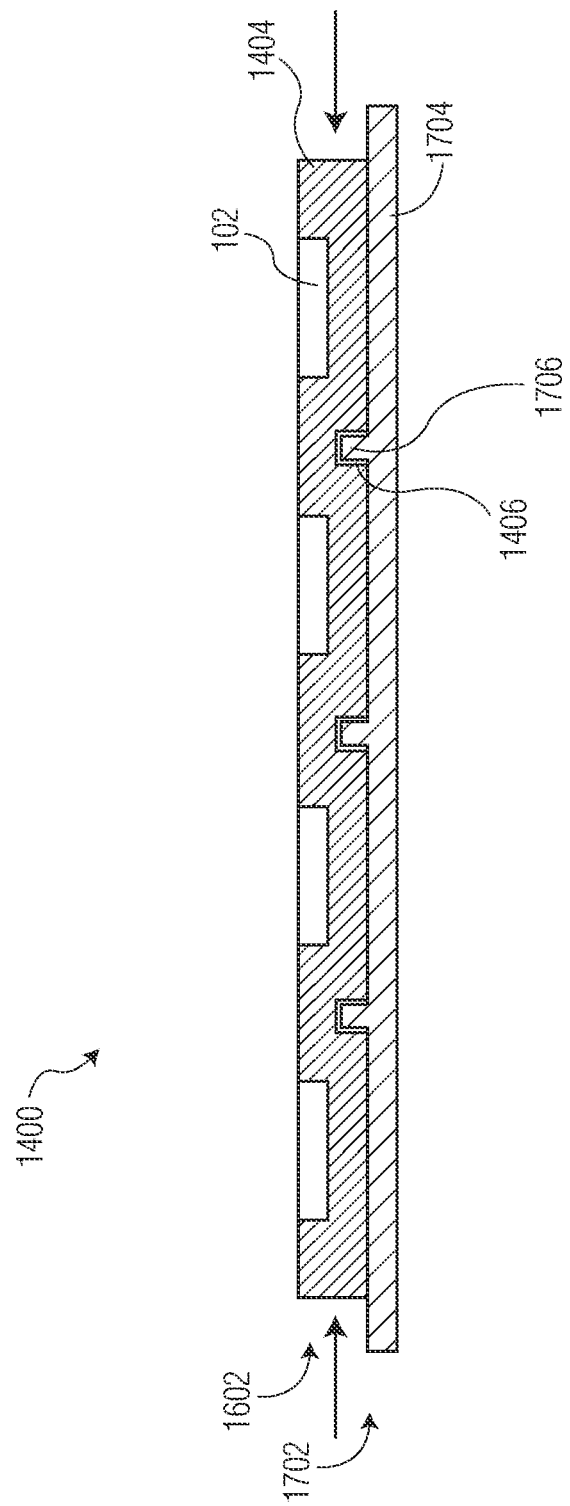

FIG. 18 illustrates, in a simplified cross-sectional view, the example semiconductor device packaging panel 1400 at a subsequent stage of manufacture in accordance with an embodiment. At this stage of manufacture, the warpage control features 1406 of the panel 1400 having the substantially flattened condition 1602 are interlocked with the mating features 1706 of the warpage control fixture 1702. In this embodiment, the panel 1400 shrinks as it cools causing tension to be applied to the panel by way of the warpage control features 1406 interlocked with the mating features 1706. With tension applied on the panel 1400 in this manner, the panel 1400 is secured in the warpage control fixture 1702 and the substantially flattened condition 1602 is sustained.

Figure 19:
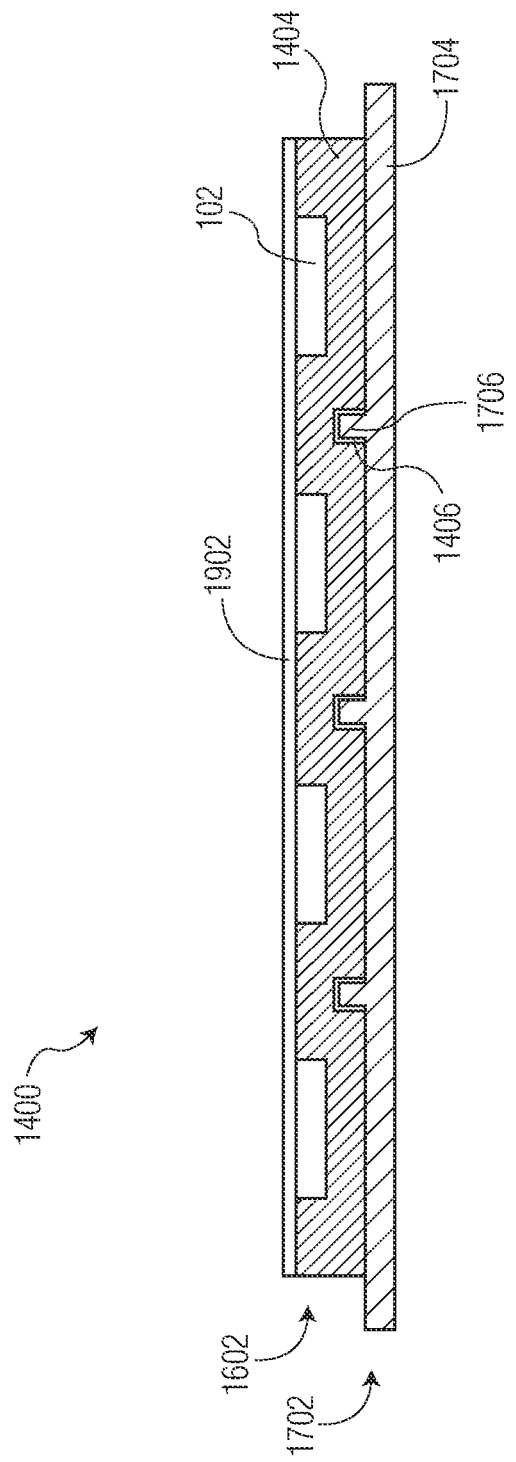

FIG. 19 illustrates, in a simplified cross-sectional view, the example semiconductor device packaging panel 1400 at a subsequent stage of manufacture in accordance with an embodiment. At this stage of manufacture, a processing layer 1902 is formed on panel 1400 while secured in the warpage control fixture 1702. With the substantially flattened panel 1400 secured in the warpage control fixture 1702, the panel 1400 may be subjected to planar-sensitive processing steps to form the processing layer 1902. In this embodiment, the processing layer 1902 may be characterized as a redistribution layer (RDL) formed over the active surface of the semiconductor die 102 and portions of the encapsulant 1404. For example, the processing layer 1902 may be formed as a series of patterned layers including a conductive layer sandwiched between a first non-conductive layer and a second non-conductive layer.

After forming the processing layer 1902, a completed panel 1400 is singulated into individual semiconductor device units using known methods and techniques such as mechanical sawing, laser cutting, and combinations thereof. In some embodiments, the plurality of warpage control features 1406 are removed during singulation when the warpage control features are located within the singulation lanes (106). In some embodiments, the panel 1400 may be subjected to back-grind operation or a fill operation to remove or fill the plurality of warpage control features before singulation.

Generally, there is provided, a method of manufacturing a semiconductor device packaging panel including: forming a panel including: placing a plurality of semiconductor die on a first side of a carrier substrate; forming a plurality of warpage control features with an encapsulant, the encapsulant encapsulating the plurality of semiconductor die and the first side of the carrier substrate; and placing the panel onto a warpage control fixture to substantially flatten the panel, the plurality of warpage control features interlocking with mating features of the warpage control fixture. The method may further include forming a redistribution layer over the plurality of semiconductor die while the panel is substantially flattened on the warpage control fixture. The forming the panel may further include removing the carrier substrate after forming the plurality of warpage control features. Tension may be applied to the panel after the plurality of warpage control features are interlocked with the mating features of the warpage control fixture. The placing the panel onto the warpage control fixture may include mechanically pressing the panel onto the warpage control fixture to interlock the warpage control features with the mating features. The warpage control fixture may include a film, the mating features integrated into the film, and the method further comprising stretching the film to apply tension to the panel. The method may further include applying heat to the panel to substantially flatten the panel before placing the panel onto the warpage control fixture. The plurality of warpage control features may be characterized as a plurality of cavities formed in the encapsulant and the mating features may be characterized as protrusions in the warpage control fixture configured to mate with the plurality of cavities. The plurality of warpage control features may be characterized as a plurality of protrusions extending from a major surface of the encapsulant and the mating features may be characterized as recesses configured to mate with the plurality of protrusions.

In another embodiment, there is provided, a method of manufacturing a semiconductor device packaging panel including: forming a panel including: placing a plurality of semiconductor die on a first side of a carrier substrate; encapsulating with an encapsulant the plurality semiconductor die and the first side of the carrier substrate; forming a plurality of warpage control features with the encapsulant during the encapsulating; and placing the panel onto a warpage control fixture, the plurality of warpage control features interlocking with mating features of the warpage control fixture to substantially flatten the panel. The method may further include removing the carrier substrate after forming the plurality of warpage control features; and forming a redistribution layer over the plurality of semiconductor die while the panel is substantially flattened on the warpage control fixture. The method may further include applying tension to the panel by way of a film incorporated in the warpage control fixture to substantially flatten the panel, the mating features integrated into the film. The plurality of warpage control features may be characterized as a plurality of protrusions extending from a major surface of the encapsulant. The method may further include applying heat to the panel to substantially flatten the panel before placing the panel onto the warpage control fixture. The method may further include removing the warpage control features by way of singulating semiconductor device units from the panel, each semiconductor device unit including at least one semiconductor die.

In yet another embodiment, there is provided, a method of manufacturing a semiconductor device packaging panel including: forming a panel including: placing a plurality of semiconductor die on a first side of a carrier substrate; encapsulating with an encapsulant the plurality semiconductor die and the first side of the carrier substrate; forming a plurality of warpage control features with the encapsulant during the encapsulating; placing the panel onto a warpage control fixture, the warpage control fixture including mating features configured to interlock with the plurality of warpage control features; and applying tension to the panel to substantially flatten the panel. The tension may be applied to the panel by way of stretching a film incorporated in the warpage control fixture, the mating features integrated into the film. The method may further include applying heat to the panel to substantially flatten the panel before placing the panel onto the warpage control fixture, the warpage control fixture comprising a rigid structure with the mating features incorporated thereon, the tension applied to the panel by way of the panel cooling while the warpage control features are interlocked with the mating features. The method may further include removing the carrier substrate after forming the plurality of warpage control features; and forming a redistribution layer over the plurality of semiconductor die while the panel is substantially flattened on the warpage control fixture. At least a portion of the plurality of warpage control features may be characterized as a plurality of protrusions extending from a major surface of the encapsulant or may be characterized as a plurality of cavities formed in the encapsulant.

By now, it should be appreciated that there has been provided a semiconductor device packaging process and apparatus for panel warpage control. Device packaging panels are formed having warpage control features configured to mate with features incorporated in a warpage control fixture. By interlocking the warpage control features with the mating features of the warpage control fixture, tension can be applied to the packaging panels in a manner sufficient to substantially flatten the panels. With the panels substantially flattened, subsequent planar-sensitive processing steps can be applied allowing for improved yield, reliability, and costs.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device packaging panel, the method comprising:
    forming a panel comprising:
        placing a plurality of semiconductor die on a first side of a carrier substrate;
        forming a plurality of warpage control features with an encapsulant, the encapsulant encapsulating the plurality of semiconductor die and the first side of the carrier substrate; and
    placing the panel onto a warpage control fixture to substantially flatten the panel, the plurality of warpage control features interlocking with mating features of the warpage control fixture.

2. The method of claim 1, further comprising forming a redistribution layer over the plurality of semiconductor die while the panel is substantially flattened on the warpage control fixture.

3. The method of claim 1, wherein forming the panel further comprises removing the carrier substrate after forming the plurality of warpage control features.

4. The method of claim 1, wherein tension is applied to the panel after the plurality of warpage control features are interlocked with the mating features of the warpage control fixture.

5. The method of claim 1, wherein placing the panel onto the warpage control fixture comprises mechanically pressing the panel onto the warpage control fixture to interlock the warpage control features with the mating features.

6. The method of claim 5, wherein the warpage control fixture includes a film, the mating features integrated into the film, and the method further comprising stretching the film to apply tension to the panel.

7. The method of claim 1, further comprising applying heat to the panel to substantially flatten the panel before placing the panel onto the warpage control fixture.

8. The method of claim 1, wherein the plurality of warpage control features is characterized as a plurality of cavities formed in the encapsulant and the mating features are characterized as protrusions in the warpage control fixture configured to mate with the plurality of cavities.

9. The method of claim 1, wherein the plurality of warpage control features is characterized as a plurality of protrusions extending from a major surface of the encapsulant and the mating features are characterized as recesses configured to mate with the plurality of protrusions.

10. A method of manufacturing a semiconductor device packaging panel, the method comprising:
    forming a panel comprising:
        placing a plurality of semiconductor die on a first side of a carrier substrate;
        encapsulating with an encapsulant the plurality semiconductor die and the first side of the carrier substrate;
        forming a plurality of warpage control features with the encapsulant during the encapsulating; and
    placing the panel onto a warpage control fixture, the plurality of warpage control features interlocking with mating features of the warpage control fixture to substantially flatten the panel.

11. The method of claim 10, further comprising:
    removing the carrier substrate after forming the plurality of warpage control features; and
    forming a redistribution layer over the plurality of semiconductor die while the panel is substantially flattened on the warpage control fixture.

12. The method of claim 10, further comprising applying tension to the panel by way of a film incorporated in the warpage control fixture to substantially flatten the panel, the mating features integrated into the film.

13. The method of claim 10, wherein the plurality of warpage control features is characterized as a plurality of protrusions extending from a major surface of the encapsulant.

14. The method of claim 10, further comprising applying heat to the panel to substantially flatten the panel before placing the panel onto the warpage control fixture.

15. The method of claim 10, further comprising removing the warpage control features by way of singulating semiconductor device units from the panel, each semiconductor device unit comprising at least one semiconductor die.

16. A method of manufacturing a semiconductor device packaging panel, the method comprising:
- forming a panel comprising:
  - placing a plurality of semiconductor die on a first side of a carrier substrate;
  - encapsulating with an encapsulant the plurality semiconductor die and the first side of the carrier substrate;
  - forming a plurality of warpage control features with the encapsulant during the encapsulating;
- placing the panel onto a warpage control fixture, the warpage control fixture including mating features configured to interlock with the plurality of warpage control features; and
- applying tension to the panel to substantially flatten the panel.

17. The method of claim 16, wherein tension is applied to the panel by way of stretching a film incorporated in the warpage control fixture, the mating features integrated into the film.

18. The method of claim 16, further comprising applying heat to the panel to substantially flatten the panel before placing the panel onto the warpage control fixture, the warpage control fixture comprising a rigid structure with the mating features incorporated thereon, the tension applied to the panel by way of the panel cooling while the warpage control features are interlocked with the mating features.

19. The method of claim 16, further comprising:
- removing the carrier substrate after forming the plurality of warpage control features; and
- forming a redistribution layer over the plurality of semiconductor die while the panel is substantially flattened on the warpage control fixture.

20. The method of claim 16, wherein at least a portion of the plurality of warpage control features is characterized as a plurality of protrusions extending from a major surface of the encapsulant or characterized as a plurality of cavities formed in the encapsulant.

* * * * *